United States Patent
Kannan et al.

(10) Patent No.: US 6,991,684 B2
(45) Date of Patent: Jan. 31, 2006

(54) HEAT-TREATING APPARATUS AND HEAT-TREATING METHOD

(75) Inventors: Hiroshi Kannan, Tokyo (JP); Noboru Tamura, Nirasaki (JP); Yasuhiko Kojima, Nirasaki (JP); Tadahiro Ishizaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 10/381,724

(22) PCT Filed: Sep. 28, 2001

(86) PCT No.: PCT/JP01/08555

§ 371 (c)(1),
(2), (4) Date: Jun. 18, 2003

(87) PCT Pub. No.: WO02/27772

PCT Pub. Date: Apr. 4, 2002

(65) Prior Publication Data

US 2004/0035359 A1 Feb. 26, 2004

(30) Foreign Application Priority Data

Sep. 29, 2000 (JP) .............................. 2000-300398

(51) Int. Cl.
*C23C 16/00* (2006.01)

(52) U.S. Cl. ........................ 118/724; 118/723; 118/715; 29/25.01

(58) Field of Classification Search ................. 118/723, 118/724, 715

See application file for complete search history.

(56) References Cited

U.S. PATENT DOCUMENTS

| 5,567,267 A | 10/1996 | Kazama et al. |
| 5,791,895 A * | 8/1998 | Kyung et al. ............... 432/253 |
| 2002/0007795 A1 * | 1/2002 | Bailey et al. ........... 118/723 R |

FOREIGN PATENT DOCUMENTS

| JP | 6244143 | 9/1994 |
| JP | 7078766 | 3/1995 |
| JP | 7153706 | 6/1995 |
| JP | 11-323549 | 11/1999 |
| JP | 2001196152 | 7/2001 |
| WO | 00/26960 | 5/2000 |

* cited by examiner

Primary Examiner—George Fourson
Assistant Examiner—Thanh V. Pham
(74) Attorney, Agent, or Firm—Crowell & Moring LLP

(57) ABSTRACT

A heater plate, which has a wafer W mounted thereon and which includes a heater in its interior, is placed on a cooling block including a coolant chamber in its interior. The cooling block includes a gas introduction pipe passing therethrough. The gas introduction pipe is connected to a space between the heater plate and the cooling block to make it possible to supply He gas as thermal conduction gas to the space. A gas suction pipe 34 is connected to the space to make it possible to suck He gas.

5 Claims, 6 Drawing Sheets

US 6,991,684 B2

HEAT-TREATING APPARATUS AND HEAT-TREATING METHOD

TECHNICAL FIELD

The present invention relates to a thermal treatment apparatus and thermal treatment method for providing film forming process and the like to objects to be processed such as semiconductor wafers one by one.

BACKGROUND ART

Generally, in the manufacture of semiconductor integrated circuits, each of film forming process, etching process, oxidation/diffusion process is provided to objects to be processed such as semiconductor wafers, etc. With the recent progress of high integration, high refining and thinning, improvement in the film quality in the above processes is the most important subject. Under such circumstances, as a film forming method for obtaining a good quality film an atomic layer deposition (hereinafter referred to as ALD) method is developed.

In the ALD, by use of a difference between absorption energy of a first layer of raw gas applied to an absorption surface and absorption energy of a second layer and the following, desired films are deposited one layer by one at the atomic level or molecular level. More specifically, temperature and pressure are controlled at the film forming time. In other words, the rise and fall in temperature and pressure are repeated and the film is formed while removing the excessive raw gases of the second layer and the following layers.

The following explains the ALD as an example in the case where a titanium nitride (TiN) film is formed using titanium tetrachloride ($TiCl_4$) and ammonia ($NH_3$) as raw gases.

The thermal treatment apparatus that performs the ALD is disclosed in Unexamined Japanese Patent Publication Nos. 6-244143, 7-78766 and 7-153706. FIG. 6 shows one example of the structure of the thermal treatment apparatus for performing the ALD.

As illustrated in FIG. 6, a thermal treatment apparatus 102 includes, for example, an aluminum chamber 104 with a substantially circular cross section. The diameter of a lower portion of the chamber 104 is formed to be smaller than that of an upper portion. The capacity of the interior of the chamber 104 is provided as small as possible, so that high exhaust efficiency can be obtained. At a side wall of the chamber 104, there is formed a quartz nozzle 106 for introducing a raw gas. The raw gas is supplied to a treatment space S through the nozzle 106.

At the side wall of the chamber 104, there is formed a gate valve 108 for loading/unloading a semiconductor wafer as an object to be processed on/from the chamber 104. The gate valve 108 is airtightly openable and closable.

At the lower portion of the chamber 104, there is formed a lower-portion space 110, which is narrower than the upper portion, as mentioned above. A hollow cylindrical shaft 112 stands from the bottom of the chamber 104 to pass through the lower portion space 110, and a joint between the chamber 104 and shaft 112 is seated by a seal material 114 such as an O ring and the like.

A disc-like mounting table 116 having a thickness t1 of a few cm is fixed to an upper end portion of the shaft 112. On the upper surface of the mounting table 116, a semiconductor wafer W is mountable. Moreover, the mounting table 116 includes a heater 118, which is formed of a resistance member placed in a predetermined pattern in its interior. The mounting table 116 is formed of sintered ceramics of, for example, aluminum nitride. The shaft 112 is formed of he same material as that of the mounting table 116, that is, aluminum nitride, and is joined to the mounting table 116 by solid-state welding 120. Moreover, in the mounting table 116, a lift pin 126 is provided to pass therethrough and to be movable up and down by an air cylinder 128.

The heater 118 is connected to a feeder line 122 passing through the hollow shaft 112, so that power is supplied to the heater 118 via the feeder line 122. Here, an interior of the shaft 112 is set to be an atmospheric state, heat of the feeder line 122 is sufficiently radiated to make it possible to prevent occurrence of burning.

A length L of the shaft 112 is set with consideration given to heat resistance of the seal material 114 formed at the lower end. More specifically, the length L1 is set to, for example, about 30 cm to ensure a sufficient temperature difference between the upper and lower ends where the mounting table 116 is provided. Moreover, at the bottom of the chamber, there is formed a cooling jacket 124 into which cooling water flows in order to protect the seal material 114.

At a lower portion side wall of the chamber 104, there is formed an exhaust port 130 communicating with the lower portion space 110. The exhaust port 130 is connected to an exhaust pipe 132 connected to an exhaust device (not shown). The exhaust device makes it possible to set atmosphere in the chamber 104 including the lower portion space 110 to be a high vacuum state.

An explanation is next given of the process for forming a TiN film by the ALD using the aforementioned thermal treatment apparatus 102.

First, the mounting table 116 is maintained at temperature that is suitable for adhering $TiCl_4$, for example, 600° C., and $TiCl_4$ gas is introduced into the chamber 104 for a short time period, for example, a few seconds. Here, the $TiCl_4$ gas may be introduced thereinto together with carrier gas as necessary. As a result, a $TiCl_4$ molecular layer is adhered onto the surface of the wafer W in a multilayer form.

Next, the interior of the chamber 104 is exhausted up to a high vacuum of, for example, about $1.33 \times 10^{-3}$ Pa ($10^{-5}$ Torr), and the temperature of the mounting table 116 is reduced to temperature that is suitable for adhering $NH_3$, for example, 300° C. in this exhausting process, the $TiCl_4$ molecular layers adhered onto the surface of the wafer W are scattered due to the absorption energy difference as leaving the first molecular layer. As a result, the $TiCl_4$ molecular layer of one layer is adhered onto the surface of the wafer W.

In a state that pressure in the chamber 104 reaches about $1.33 \times 10^{-3}$ Pa and the temperature of the mounting table 116 is reduced to about 300° C. by such exhausting, the $NH_3$ gas is introduced into the chamber 104 for a short time period, for example, a few seconds. By the introduction of the gas, pressure in the chamber 104 is returned to about 133 Pa (1 Torr). Here, the $NH_3$ gas may be introduced thereinto together with carrier gas as required. Accordingly, the $TiCl_4$ molecular layer of one layer on the wafer surface and the $NH_3$ gas are reacted with each other to form a TiN layer of one layer, and an $NH_3$ molecular layer is adhered onto an upper surface of the TiN layer in a multilayer form.

After that, the interior of the chamber 104 is exhausted up to about $1.33 \times 10^{-3}$ Pa and the temperature of the mounting table 116 is increased to, for example, 600° C. At this time, the second $NH_3$ molecular layer and the following are scattered excepting the first $NH_3$ molecular layer adhered onto the surface of the TiN film.

Next, a $TiCl_4$ gas is introduced into the chamber 104 for a few seconds. At this time, the $NH_3$ molecular layer of one layer on the TiN film and the $TiCl_4$ gas are reacted with each other to form a one-layered TiN films and a TiCl$_4$ molecular layer is adhered onto this TiN film in a multilayer form. Accordingly, a two-layered TiN film is formed on the surface of the wafer W.

Afterwards, the same operations as mentioned above, that is, the supply and exhaust of each raw gas and the temperature rise and fall of the mounting table 116 are repeated the predetermined number of times, and the TiN films are deposited one layer by one to as to obtain a TiN film with a desirable thickness. The aforementioned operations are repeated, for example, 100 to a few hundreds times.

As mentioned above, according to the ALD, since the films can be formed one lay by one, the film thickness can be controlled with high accuracy. Moreover, the film with high quality can be obtained as a whole. Furthermore, since the films can be deposited one molecular layer by one, it is possible to provide a gradient in the characteristic; for example, the film quality is gradually changed.

By the way, as explained above, in the ALD, it is required that the temperature rise and fall of the mounting table 116 and the supply and exhaust of the gas to/from the chamber 104 should be repeated many times. For this reason, in order to obtain high productivity and throughput, the temperature rise and fall and the exhaust must be performed for a short time period and at high speed.

However, in the aforementioned treatment apparatus 102, since the thickness t1 of the mounting table 116 is a few cm, the heat capacity is relatively large and much time is required for the temperature rise and fall. The temperature fall of the mounting table 116 is performed by escaping heat to the cooling jacket 124 provided at the bottom of the chamber 104 through the shaft 112 jointed thereto. However, thermal conductivity of the shaft 112 formed of ceramics is relatively low. Even in this point, much time is required the temperature rise and fall of the mounting table 116.

In order to improve the temperature fall rate, a reduction in the length of the shaft 112 and the use of material having a good thermal conductivity can be considered. However, if the length of the shaft 112 is too short, the seal material 114 with heat-resistant temperature of about 150° C. to 200° C. is damaged by heat. Moreover, if other material having a different linear expansion coefficient from the ceramic mounting table 116 is used in the shaft 112, breakage occurs in the vicinity of the joint 120 therebetween.

Furthermore, if the length L1 of the shaft 112 is ensured to some degree, the volumetric capacity of the lower portion space 110 is increased, so that the entire volumetric capacity of die chamber 104 is also increased. As a result, much time is required to attain exhaust to a predetermined vacuum state.

Thus, in the conventional thermal treatment apparatus, there was a problem that much time was required for the temperature rise and fall of the mounting table and the object to be processed and much time was also required for vacuum exhaust of the interior of the chamber.

DISCLOSURE OF INVENTION

In order to solve the aforementioned problems, an object of the present invention is to provide a thermal treatment apparatus and thermal treatment apparatus capable of increasing and decreasing temperature of an object to be processed at high speed.

Moreover, an object of the present invention is to provide a thermal treatment apparatus and thermal treatment apparatus capable of exhausting the interior of a chamber at high speed.

In order to attain the above object, the present invention provides a thermal treatment apparatus having a chamber and a heater plate being provided to the chamber. The heater plate has a processing object mounted on a first surface thereof and includes a heater in its interior to be capable of heating the mounted processing object. A power supply pipe including parts for supplying electric power to the heater and connected to a second surface of the heater plate is included. A cooling block has the heater plate mounted on it to come in contact with the second surface of the heater plate and is capable of cooling the heater plate. A gas introduction parts is provided for introducing thermal conduction gas into a space between the second surface and the cooling block.

BEST MODE FOR CARRYING OUT THE INVENTION

The following specifically explains the thermal treatment apparatus according to an embodiment of the present invention with reference to the drawings. The treatment apparatus of this embodiment forms a titanium nitride (TiN) film on a surface of a semiconductor wafer (thereinafter referred to as wafer W) from titanium tetrachloride (TiCl$_4$) and ammonia (NH$_3$) by an atomic layer deposition (ALD) method.

Figure 1:
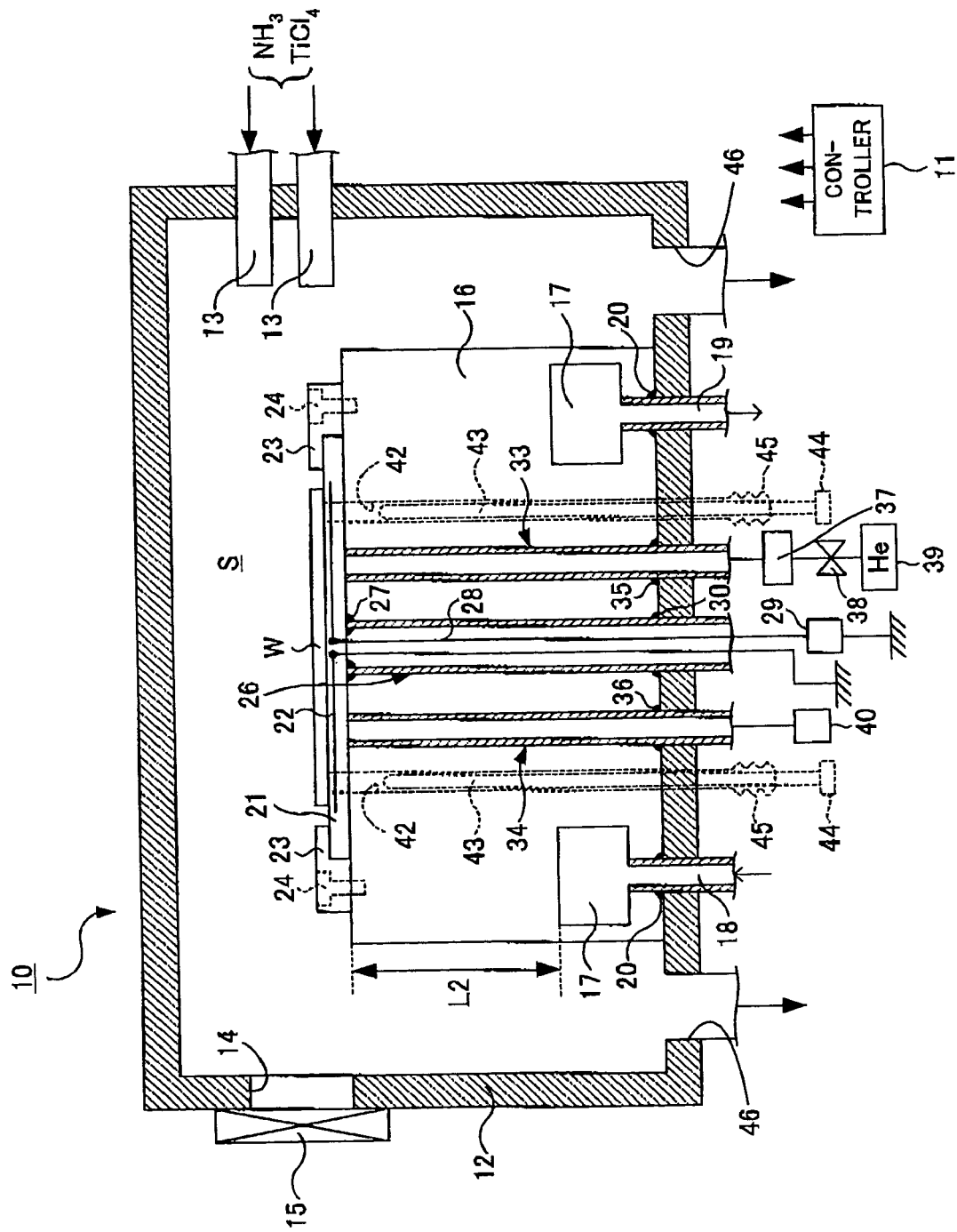
FIG. 1 shows a structure of a cross section of a thermal treatment apparatus according to one embodiment of the present invention.
Figure 2:
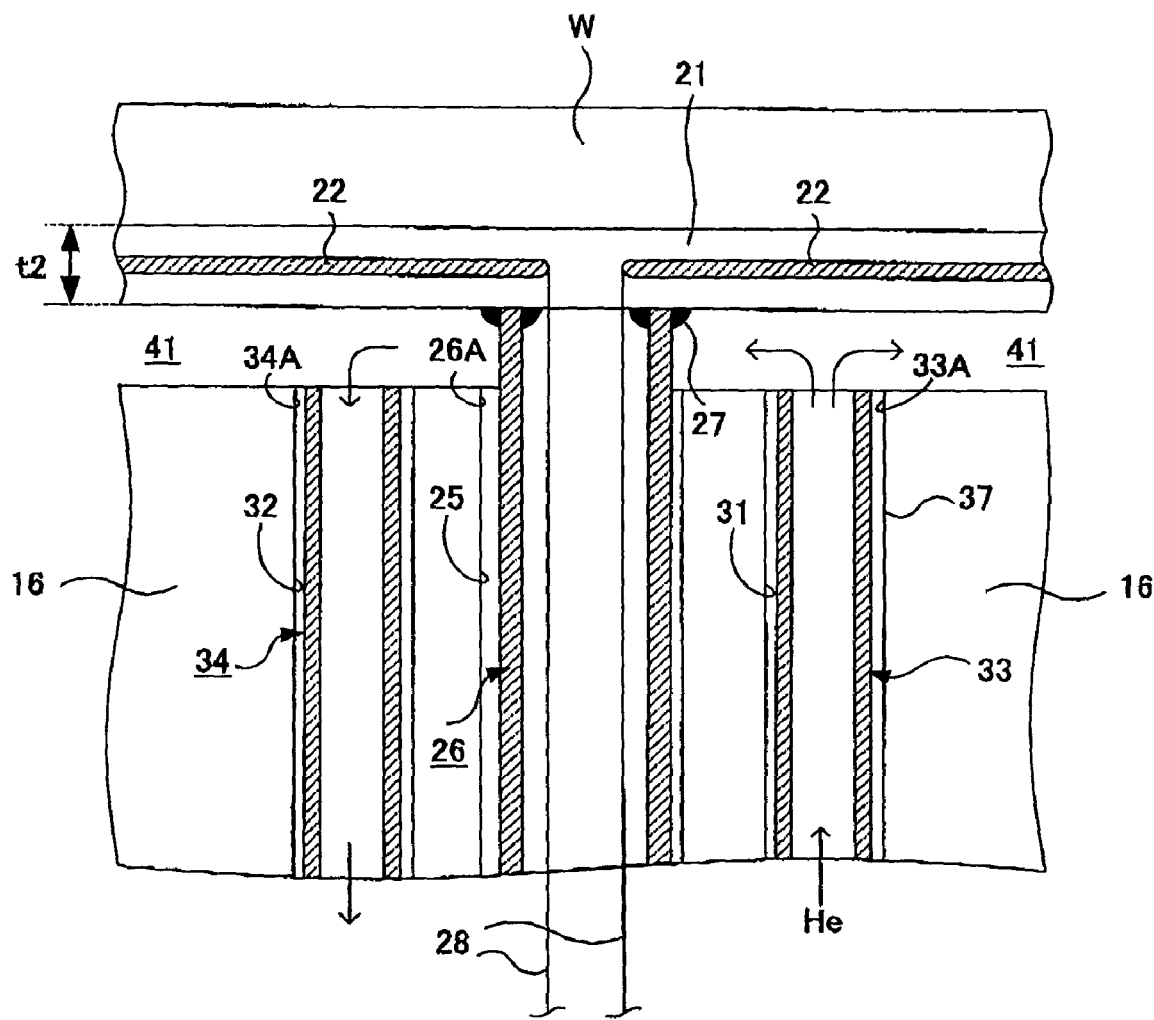
FIG. 2 is a partially enlarged view of the thermal treatment apparatus of FIG. 1.

FIG. 1 shows a structure of a cross section of a thermal treatment apparatus 10 according to one embodiment of the present invention. FIG. 2 is a partially enlarged view of the thermal treatment apparatus 10 shown in FIG. 1.

Here, the thermal treatment apparatus 10 includes a controller 11 that controls the entire operation relevant to the film forming process of the thermal treatment apparatus 10 In addition, the specific operation of the controller 11 is omitted to understand the invention easily.

As illustrated in FIG. 1, the thermal treatment 10 includes a substantially cylindrical chamber 12 formed of, for example, aluminum. At a side wall of the chamber 12, multiple, for example, two nozzles 13 of quartz and the like, are formed. A raw gas is introduced into a treatment space S from a raw gas source (not shown) at a predetermined flow through the nozzles 13. Additionally, a shower head may be used in place of the nozzles 13.

Moreover, at the side wall of the chamber 12, there is formed a load/unloading port 14 for loading/unloading the wafer W, which is the object to be processed, to/from the chamber 12. At the loading/unloading port 14, there is formed a gate valve 15, which is airtightly openable and closable.

At the bottom of the chamber 12, there is provided a columnar cooling block 16, which is formed of material having a good thermal conductivity, for example, aluminum.

The treatment space S is formed between an upper surface of the cooling block 16 and a ceiling portion of the chamber 12.

At a lower portion of the cooling block 16, there is formed a coolant chamber 17 into which a coolant such as cold water flows. The coolant chamber 17 is connected to a coolant introduction pipe 18 and a coolant exhaust pipe 19 both which extend to pass through the bottom of the chamber 12. A joint portion between the bottom of the chamber 12 and each of the coolant introduction pipe 18 and coolant exhaust pipe 19 is sealed by a seal material 20 such as an O ring and the like. The controller 11 adjusts the flow of the coolant flowing into the coolant chamber 17 to control cooling power.

The upper surface of the cooling block 16 is flat, and a heater plate 21 is provided thereon. The heater plate 21 is formed of ceramics of such as aluminum nitride, and has a plane shape. On the heater plate 21, a wafer W as an object to be processed is placed.

As illustrated in FIG. 2, the heater plate 21 has a thin resistance heater 22 placed in a predetermined pattern in its interior, thereby the wafer W mounted on the heater plate 21 can be heated. Here, it is assumed that thickness t2 of the heater plate 21 is, for example, about 5 mm. For manufacturing the heater plate 21, a method described in Unexamined Japanese Patent Publication 2001-196152 can be used. A length L2 between the coolant chamber 17 and the heater plate 21 is set to, for example, 5 to 15 cm though it depends on cooling power.

Moreover, as illustrated in FIG. 1, a periphery of the heater plate 21 is held by a ring-shaped clamp member 23. The clamp member 23 is formed of the same material as the heater plate 21, that is, aluminum nitride in this case. The clamp member 23 is secured to the cooling block 21 by a screw 24.

As illustrated in FIG. 2, a first through hole 25 is formed to pass through the bottom of the cooling block 16 and that of the chamber 12. In the through hole 25, there is provided a raceway 26 to pass therethrough, and its lower end extends to an exterior of the chamber 12. The raceway 26 is formed of the same material as the heater plate 21, that is, aluminum nitride in this case. An upper end 26A of the raceway 26 is airtightly sealed to a lower surface of the heater plate 21 by solid-state welding 27, and an interior of the raceway 26 is set to be an atmospheric state.

Referring to FIG. 1, in the interior of the raceway 26, a lead wire 28, which is connected to the resistance heater 22 provided in the heater plate 21, is provided to run therethrough. The lead wire 28 is connected to a power source 29. The controller 11 controls the power source 29 to perform a temperature control of the heater plate 21. Furthermore, in the raceway 26, other wire such as a lead wire connected to a thermocouple for measuring temperature is provided to pass therethrough though this is not illustrated.

A joint between the raceway 26 and the bottom of the chamber 12 is sealed by a seal material 30 such as an O ring and the like.

Moreover, as illustrated in FIG. 2, around the raceway 26, there are formed second and third through holes 31 and 32 to pass through the bottom of the cooling block 16 and that of the chamber 12. In the second and third through holes 31 and 32, there are respectively provided a gas introduction pipe 33 and a gas suction pipe 34, both which are formed of, for example, stainless steel, to pass therethrough. Referring to FIG. 1, a joint between the gas introduction pipe 33 and the bottom of the chamber 12 and a joint between the gas suction pipe 34 and the bottom of the chamber 12 are sealed by seal materials 35 and 36 such as an O ring and the like, respectively.

The gas introduction pipe 33 is connected to a thermal conduction gas source 39, which is placed at the outside of the chamber 12, through a flow control device 37 such as a mass flow controller and the like and a valve 38. The thermal conduction gas source 39 contains a helium gas (He). The controller 11 controls the flow control device 37 and valve 38 to perform control of supply of the thermal conduction gas and the supply amount thereof.

While, the gas suction pipe 34 is connected to a pump 40. In addition, the gas suction pipe 34 may be connected to the pump 40 through an APC (Auto Pressure Controller).

As illustrated in FIG. 2, the heater plate 21 is simply mounted on the cooling block 16. Accordingly, a slight irregular space 41 is present between the heater plate 21 and the cooling block 16. A gas outlet 33A positioned at the upper end of the gas introduction pipe 33 is formed to face the space 41, and thermal conduction gas such as He and the like can be introduced into the space 41 therefrom. By introducing the thermal conduction gas into the space 41 at the time of the temperature fall of the heater plate 21, thermal conductivity efficiency between the heater plate 21 and the cooling block 16 is improved to obtain a high cooling rate of the heater plate 21.

Here, a gas outlet 33A positioned at the upper end of the gas suction pipe 33 is formed to face the space 41, and thermal conduction gas such as He existing in the space 41 is sucked and exhausted. This prevents the terminal conduction gas introduced into the space 41 from being leaked to the treatment space S. Moreover, the controller 11 controls the pump 40 and the like to perform exhaust in accordance with the introduction of the thermal conduction gas as described later.

Referring to FIG. 1, multiple, for example, three lift pin holes 42 are formed to pass through the cooling block 16, the bottom of the chamber 12 and the heater plate 21. Lift pins 43, formed of quartz and the like, can be passed through the lift pin holes 42, respectively. Moreover, a lower end portion of each lift pin 43 is coupled to a common coupling ring 44. By moving up and down the coupling ring 44 by an actuator (not shown), the lift pin 43 ascends and descends integrally. By the ascent and descent operations, a top end of each lift pin 43 appears from the upper surface of the heater plate 21 to perform delivery of the wafer W.

At a joint between each lift pin hole 42 and the bottom of the chamber 12, a bellows 45, formed of, for example, metal, is formed. The bellows expands and contracts to make it possible to move up and down the lift pin 43 in a state that the airtightness of the chamber 12 is maintained.

At the bottom of the chamber 12, an exhaust port 46 is formed. The exhaust port 46 is connected to an exhaust device such as a vacuum pump (not shown). The controller 11 controls the exhaust device to exhaust the interior of the chamber 12 to, for example, pressure equivalent to a vacuum.

Figure 3:
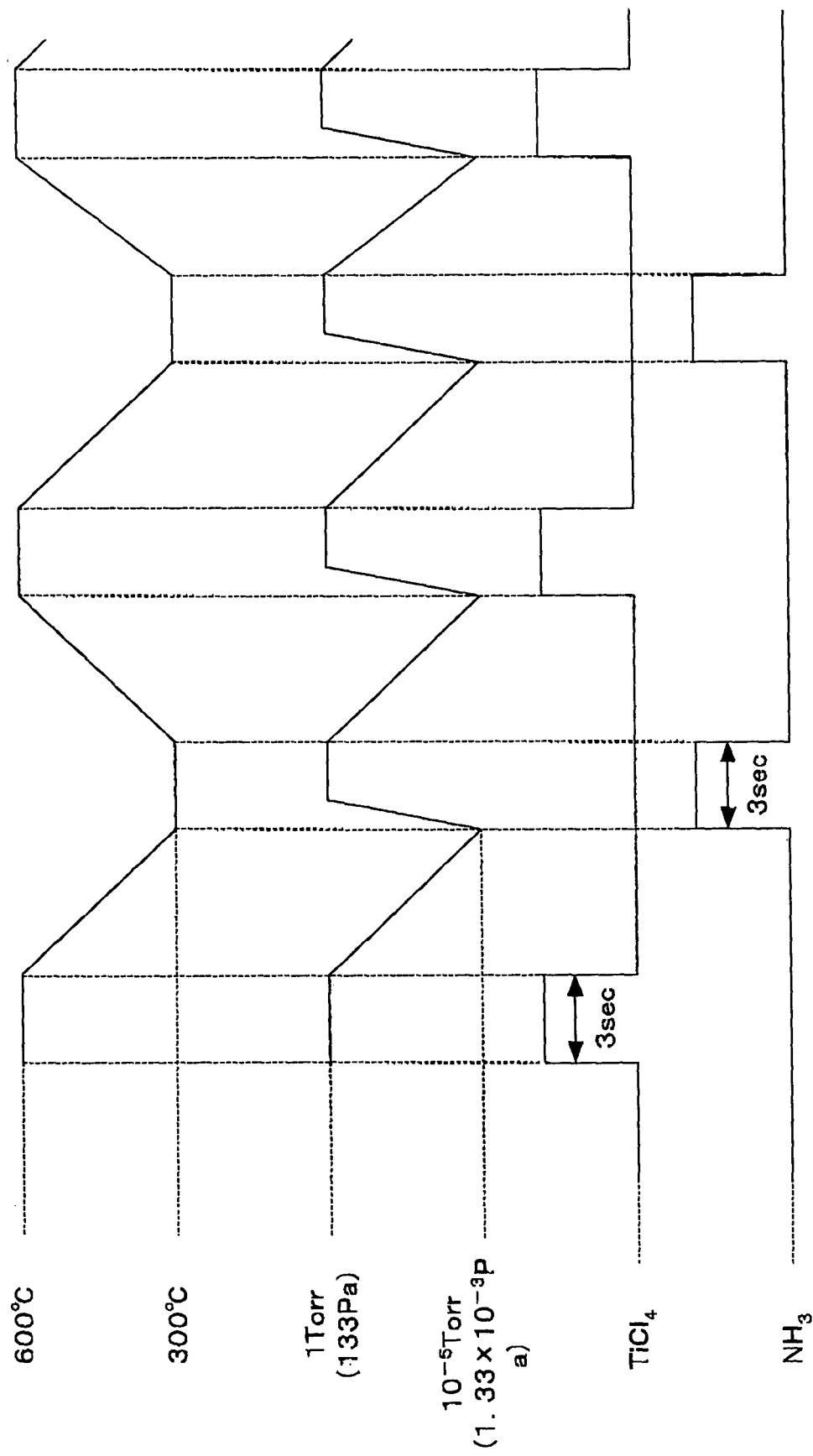
FIG. 3 is a chart of a treatment method according to the embodiment of the present invention.

An explanation is next given of the film forming method using the above-structured thermal treatment apparatus 10 with reference to FIGS. 3 and 4.

FIG. 3 is one example of a chart showing a temperature profile of the heater plate 21, a pressure profile of the chamber 12, and supply timing of the raw gas. FIG. 4 are views each schematically showing a state of a TiN film formation.

First of all, an unprocessed wafer W is held by a transfer arm (not shown) and loaded into the chamber 12 through the opened gate valve 15 and the loading and unloading port 14. The loaded wafer W is delivered to the ascended lift pin 43, and is mounted on the heater plate 21 when the lift pin 43 descends.

After the transfer arm withdraws, the controller 11 closes the gate value 15 and starts to exhaust the interior of the chamber 12 by the exhaust device (not shown). This starts the film forming process.

Additionally, the coolant always flows into the coolant chamber 17 of the cooling block 16 to cool the cooling block 16 during the film forming process set forth below.

First, the interior of the chamber 12 is exhausted up to a predetermined pressure, for example, about 133 Pa (1 Torr) and the heater plate 21 is increased up to temperature that is suitable for adhering $TiCl_4$, for example, 600° C. Under this state, a $TiCl_4$ gas is introduced into the chamber 104 for a few seconds, for example, three seconds. In addition, though supply time is not particularly limited, a few seconds may be sufficient. As a result, a $TiCl_4$ molecular layer 50 is adhered onto the surface of the wafer W in a multilayer form as shown in FIG. 4A.

Next, the controller 11 decreases the pressure of the interior of the chamber 12 to, for example, about $1.33 \times 10^{-3}$ Pa ($10^{-5}$ Torr). At the same time, the controller 11 interrupts or reduces supply power to the heater plate 21, so that the temperature of the heater plate 21 is decreased to temperature that is suitable for $NH_3$, for example, 300° C.

At the time of the temperature fall, the controller 11 introduces the thermal conduction gas such as He and the like into the space 41 to increase thermal conductivity efficiency between the heater plate 21 and the cooling block 16 and expedite the temperature fall of the heater plate 21. Moreover, at the same time, the controller 11 sucks the thermal conduction gas in the space 41 through the gas suction pipe 34. The temperature fall rate at this time is, for example, about 100° C./min.

Figures 4A, 4B, 4C, 4D:
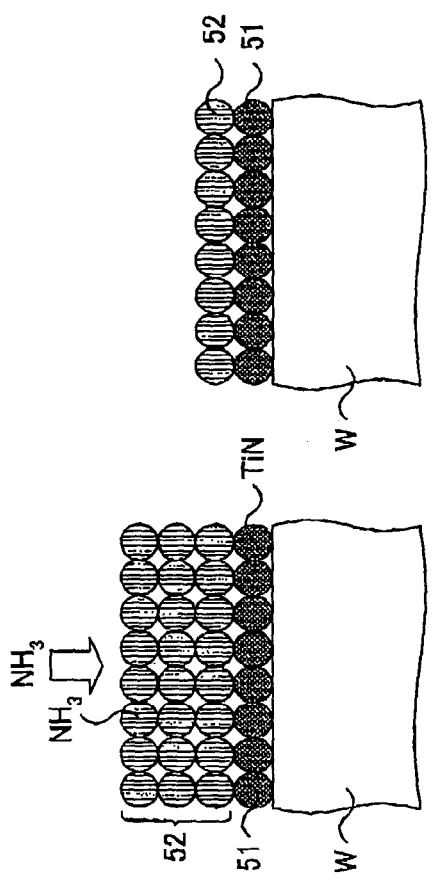
FIGS. 4A to 4H are schematic views each showing a state of a film formation.

Thus, in the exhaust process, the $TiCl_4$ molecular layers 50 adhered onto the surface of the wafer W are scattered due to the absorption energy difference excepting the first $TiCl_4$ molecular layer 50 as shown in FIG. 4B. As a result, the $TiCl_4$ molecular layer 50 of one layer is adhered onto the surface of the wafer W.

In this way, in a state that pressure in the chamber 12 reaches about $1.33 \times 10^{-3}$ Pa and the temperature of the heater plate 21 is reduced to about 300° C., an $NH_3$ gas is introduced into the chamber 12 for a short time period, for example, three seconds. In addition, though the $NH_3$ gas introduction time is not particularly limited, a few seconds may be sufficient.

Accordingly, as shown in FIG. 4C, the $TiCl_4$ molecular layer Or one layer on the wafer surface reacts with the introduced $NH_3$ molecule to form a TiN layer 51 of one layer. Moreover, and an $NH_3$ molecular layer 52 is adhered onto the formed TiN layer 51 in a multilayer form.

Next, the pressure of the chamber 12 that reached about 133 Pa by the introduction of $NH_3$ gas is reduced to about $1.33 \times 10^{-3}$ Pa, again. At the same time, the temperature of the heater plate 21 is reduced to about 600° C., again. The temperature rise rate at this time is, for example, about 100° C./min. Additionally, before increasing the temperature of the heater plate 21, the controller 11 stops the supply of gas to the space 41 and the exhaust of gas from the space 41. This reduces the thermal conductivity efficiency between the heater plate 21 and the cooling block 16 to prevent the temperature rise rate of the heater plate 21 from being reduced.

In the aforementioned exhaust process, the $NH_3$ molecular layers 52 adhered onto the TiN layer 51 are scattered excepting the first $NH_3$ molecular layer 52 as shown in FIG. 4D. Accordingly, at this time, only the $NH_3$ molecular layer 52 of one layer is adhered onto the TiN layer 51.

Figures 4E, 4F, 4G, 4H:
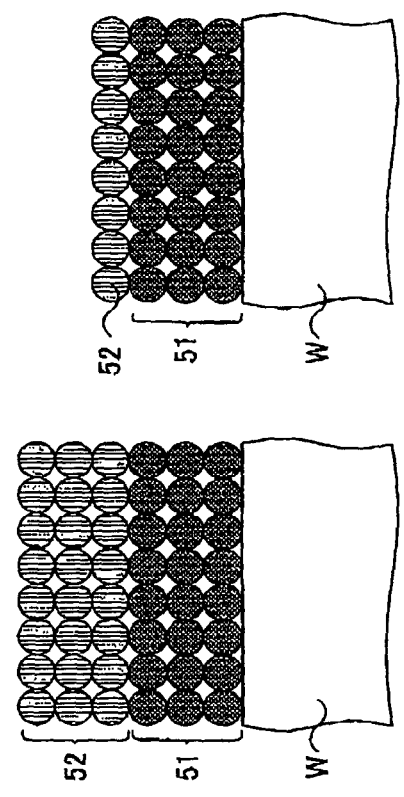

Next, a $TiCl_4$ gas is introduced into the chamber 12 again. At this time, as shown in FIG. 4E, the $NH_3$ molecular layer 52 of one layer on the TiN layer 51 reacts with $TiCl_4$ to form a new TiN layer 51, and the $TiCl_4$ molecular layer 50 is adhered onto the TiN layer 51 in a multilayer form. Accordingly, at this point, two-layered TiN layer 51 is formed on the wafer W.

Thereafter, a third TiN layer 51 is formed by introducing an $NH_3$ gas as shown in FIG. 4F, and the $NH_3$ molecular layers 52 are exhausted and removed excepting the first $NH_3$ molecular layer 52 adhered on the third TiN layer 51. In this way, the supply and exhaust of each raw gas and the temperature rise and fall of the temperature of the heater plate 21 are repeated the predetermined number of times and the TiN layers 51 are deposited one layer by one in the same manner as the above to as to obtain a TiN film 51 with a desirable thickness. The aforementioned operations are repeated, for example, 100 to a few hundreds times.

As explained above, in the thermal treatment apparatus 10 according to this embodiment, though the heater plate 21 is formed of ceramics, the thickness is as low as about 5 mm. For this reason, the heat capacity of the heat plate 21 is relatively small. In addition, the entire lower surface of the heater plate 21 contacts the cooling block 16 so as to ensure a relatively large heat transfer surface. In view of these points, a high temperature fall rate of the heater plate 21 can be obtained and a high throughput can be also obtained.

Moreover, at the time of the temperature fall of the heater plate 21, the thermal conduction gas is introduced into the space 41 between the heater plate 21 and cooling block 16. This increases the thermal conductivity efficiency therebetween and improves the temperature fall rate of the heater plate 21. In addition, the thermal conduction gas introduced into the space 41 is sucked through the gas suction pipe 34 connected to the space 41, and leakage of gas to the treatment space S is prevented. Moreover, at the time of the temperature rise of the heater plate 21, the introduction of thermal conduction gas is stopped to prevent the temperature rise rate from being reduced.

Furthermore, the cooling block 16 is formed of not ceramics but metal material whose thermal conductivity is relatively high. This makes it possible to miniaturize the cooling block 16, which is the cooling mechanism of the heater plate 21. Even if the cooling block 16 is miniaturized, it is possible to prevent breakage due to a difference in coefficient of thermal expansion based on occurrence of a large temperature gradient.

As described above, the cooling block 16 can be miniaturized, and for example, height L2 can be set to about 10 cm. Accordingly, the volumetric capacity of the chamber 12 resultantly becomes small. This makes it possible to perform high speed exhaust (vacuum drawing) of the interior of the chamber 12, so that a high throughput can be obtained.

Moreover, the heater plate 21 is indirectly fixed to the cooling block 16 by the clamp member 23. The difference in coefficient of thermal expansion between the heater plate 21 and the cooling block 16 is permitted by the clamp member 23, thereby preventing the breakage and deterioration at the time of the temperature rise and fall of the heater plate 21.

Moreover, in the above-mentioned TiN film forming process, the using gas and the film forming conditions of temperature and pressure are no more than one example.

Accordingly, regarding the gas type to be used, any type may be possible if the TiN film is formable, and the film forming conditions can be, of course, set respectively in accordance with the gas type to be used.

Furthermore, in the aforementioned embodiment, the TiN film was formed. However, the present invention is not limited to this. The present invention can be, of course, applied to the case in which other kinds of films are formed.

Moreover, in the aforementioned embodiment, the heater plate 21 was formed of AlN ceramics having good resistance and corrosion resistance. However, the present invention is not limited to this. The heater plate 21 can be formed of other ceramic materials or materials other than the ceramics.

In the aforementioned film forming process, the extra molecular layers adhered onto the surface were removed by exhaust to the high vacuum state and only the first molecular layer was left. However, the exhaust process may be performed by a purge using inert gas. In this case, partial pressure of the raw gas in the chamber in purge may be reduced to a predetermined pressure. In addition, argon, helium, xenon, neon, nitrogen and the like can be provided as inert gas.

Also, in the aforementioned embodiment, the cooling block 16 had the coolant chamber 17 and was cooled when the coolant flowed into the coolant chamber 17. However, the cooling mechanism for cooling the cooling block 16 is not limited to this, and any mechanism may be possible Moreover, the gas outlet 33A and suction 34A were provided around the raceway 26, respectively. However, the gas outlet 33A and suction 34A may be provided at any position if the heater plate 21 can be uniformly cooled.

Figure 5:
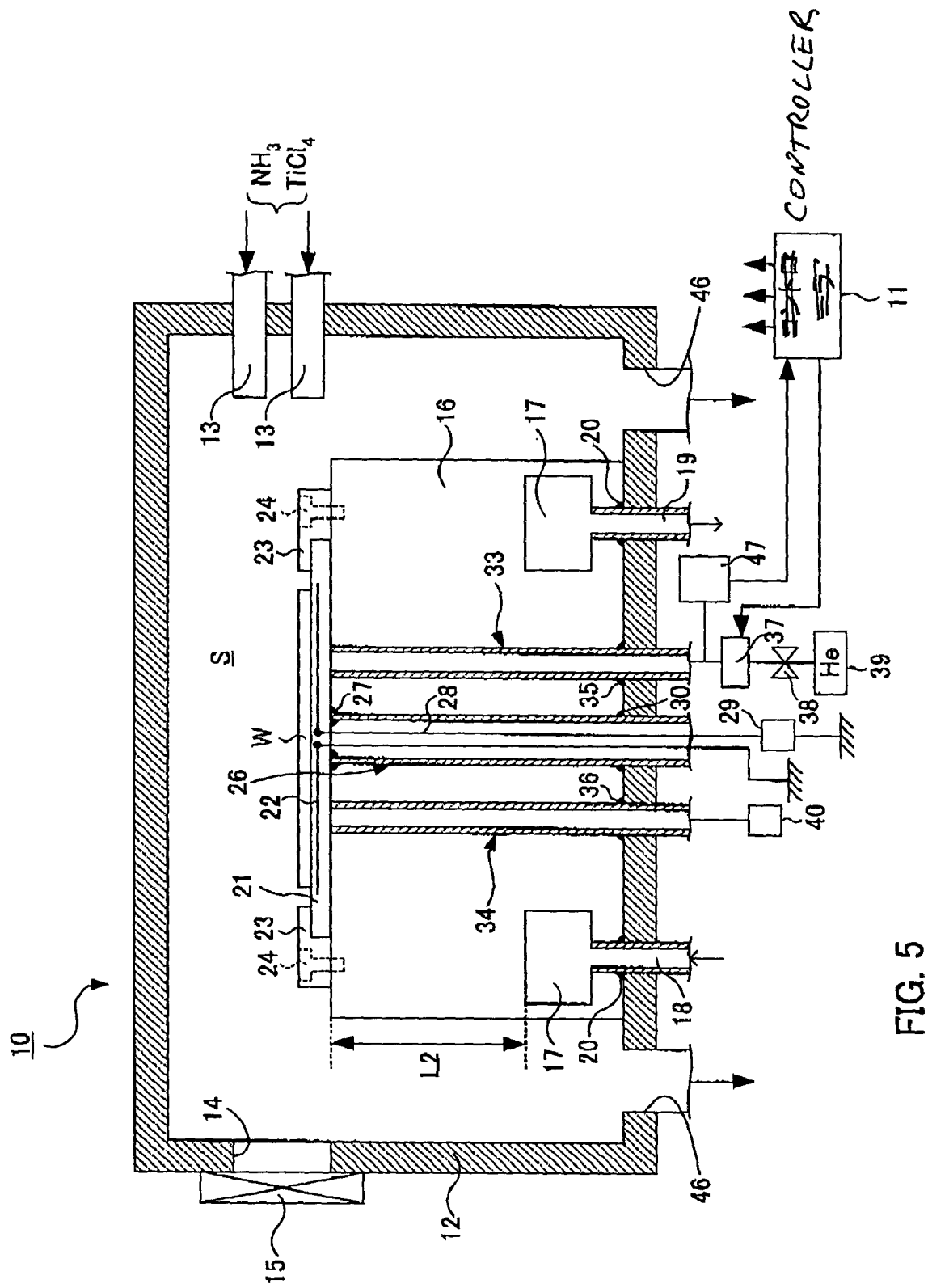
FIG. 5 shows a structure of the thermal treatment apparatus according to another embodiment of the present invention.
Figure 6:
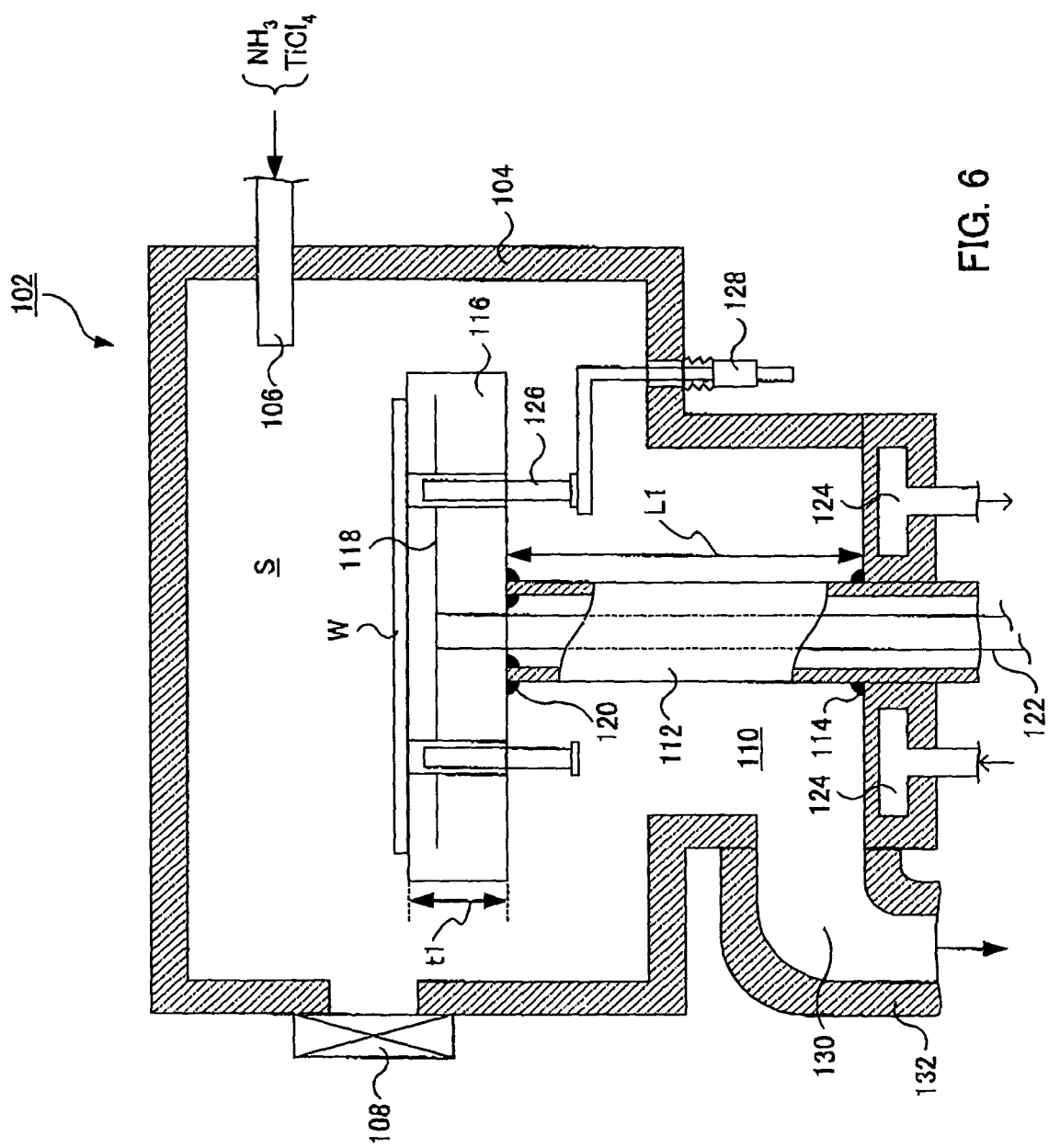
FIG. 6 shows a structure of a cross section of a conventional thermal treatment apparatus.

In the aforementioned embodiment, the controller 11 controlled the start and stop introducing gas between the heater plate 21 and the cooling block 16 and the flow was not precisely controlled. However, when damage and deterioration are caused in the substrate as an object to be processed and the heater plate 21 by a rapid temperature change, the controller 11 adjusts the flow of gas by the flow control device 37 and valve 38, so that the temperature gradient may be relaxed. Moreover, the controller 11 may control the temperature rise and fall rates of the heater plate 21 based on not the flow of gas but the pressure of gas. In this case, for example, as shown in FIG. 5, a pressure gauge 47 may be provided at the exhaust side of the flow control device 37. The controller 11 receives pressure data of gas from the pressure gauge 47 and controls the flow control device 37.

Furthermore, in the aforementioned embodiment, explanation was given using the semiconductor wafer as the object to be processed. However, the present invention is not limited to this. The present invention can be, of course, applied to a liquid crystal display substrate, a glass substrate and the like.

INDUSTRIAL APPLICABILITY

The present invention is effectively available to the manufacture of electronic devices such as a semiconductor device, et.

This application is based on Japanese Patent Application No. 2000-300398 filed on Sep. 29, 2000 and including specification, claims, drawings and summary. The disclosure of the above Japanese Patent Application is incorporated herein by reference in its entirety.

What is claimed is:

1. A thermal treatment apparatus comprising:
   a chamber;
   a heater plate being provided in said chamber, having a processing object mounted on a first surface thereof and including a heater in its interior to be capable of heating said mounted processing object;
   a power supply pipe including parts for supplying electric power to said heater and connected to a second surface of said heater plate;
   a cooling block mounted to come in contact with said second surface and capable of cooling said heater plate;
   gas introduction parts for introducing thermal conduction gas into a space between said second surface and said, and wherein the power supply pipe and said gas introduction parts are located inside that cooling block.

2. The thermal treatment apparatus according to claim 1, further comprising a flow adjusting device for adjusting the flow of the thermal conduction gas.

3. The thermal treatment apparatus according to claim 1, further comprising a pressure gauge for measuring pressure of the thermal conduction gas, wherein the flow is adjusted based on pressure data from said pressure gauge.

4. The thermal treatment apparatus according to claim 1 wherein said power supply pipe is made of a material which is a same material as that of said heater plate.

5. The thermal treatment apparatus according to claim 1 wherein said power supply pipe is formed to be hollow and maintained at atmospheric pressure in the hollow portion.

* * * * *